(12) United States Patent
Khoshgard et al.

(10) Patent No.: US 9,806,732 B1
(45) Date of Patent: Oct. 31, 2017

(54) CALIBRATION OF HIGH SPEED ANANLOG-TO-DIGITAL CONVERTERS

(71) Applicant: SiTune Corporation, San Jose, CA (US)

(72) Inventors: Mahdi Khoshgard, Los Gatos, CA (US); Vahid Mesgarpour Toosi, Los Altos, CA (US); Marzieh Veyseh, Los Altos, CA (US)

(73) Assignee: SITUNE CORPORATION, San Jose, CA (US)

( * ) Notice: Subject to any disclaimer, the term of this patent is extended or adjusted under 35 U.S.C. 154(b) by 0 days.

(21) Appl. No.: 15/455,997

(22) Filed: Mar. 10, 2017

(51) Int. Cl.
*H03M 1/00* (2006.01)
*H03M 1/10* (2006.01)
*H03M 1/12* (2006.01)

(52) U.S. Cl.
CPC ....... *H03M 1/1023* (2013.01); *H03M 1/1205* (2013.01)

(58) Field of Classification Search
CPC .................. H03M 1/1023; H03M 1/1205
USPC .................................. 341/120–155
See application file for complete search history.

(56) References Cited

U.S. PATENT DOCUMENTS

| 6,320,426 B1* | 11/2001 | Shih ................. H03K 3/356139 327/65 |
| 2002/0011944 A1* | 1/2002 | Wu ...................... H03M 1/1033 341/120 |
| 2005/0201287 A1* | 9/2005 | Welborn ............ H03H 17/0223 370/235 |
| 2008/0180289 A1* | 7/2008 | Su ......................... H03M 1/002 341/120 |
| 2016/0301420 A1* | 10/2016 | Xu ...................... H03M 1/1023 |

* cited by examiner

*Primary Examiner* — Lam T Mai
(74) *Attorney, Agent, or Firm* — Hogan Lovells US LLP

(57) ABSTRACT

The present disclosure relates to implementations of a method and a system for calibrating the system that includes analog-to-digital converters (ADCs). The method, performed on the system's corresponding components include, providing, from a signal generator, a first signal during a calibration mode. Parallel ADCs provide ADC outputs associated with the first signal. First parallel filters provide derivative signals associated with the ADC outputs. Second and third parallel filters provide first and second band-stop filtered signals associated with the ADC outputs and the derivative signals, respectively. The disclosure includes multiplying the first and the second band-stop filtered signals and selecting a portion of the multiplied signals that are accumulated for storage. The system incorporating these components performing these features is, accordingly, calibrated.

20 Claims, 5 Drawing Sheets

CALIBRATION OF HIGH SPEED ANANLOG-TO-DIGITAL CONVERTERS

TECHNICAL FIELD

The present disclosure generally relates to modem technology and to calibration of high speed analog-to-digital converters (ADCs) using novel integrated circuits.

BACKGROUND

A network for communications, including for cable television, phone, and internet data traffic, typically includes a base station, one or more head-ends, one or more intermediate hubs, and the subscriber facilities. The subscriber facilities typically represent the end of the line and include one or more modems, routers, and the consuming technology—phones, televisions, computers, laptops, electronic tablets, smartphones, InternetOfThings (IoT) devices, and other internet-enabled devices.

Receivers may have digital components working together with analog components as a system-on-a-chip (SoC). Different clock sources working with the digital components have the same sampling clock frequency but different sampling clocks phases, and consequently, different and unknown time offsets. Analog to digital converters (ADCs) convert analog signals into digital signals. For high frequency signals, multiple ADCs may be needed in the circuit because a single high speed ADC is subject to speed and time limitations. Consequently, multiple parallel ADCs, with lower frequencies are applicable to convert the high frequency signals, and multiple sources are needed to generate multiple clocks for these ADCs.

SUMMARY

The present disclosure resolves deficiencies in typical processes for calibration of high speed ADCs. Pertinently, the present disclosure provides a calibration mode for a system using a calibration tone to estimate phase for the system, thereby providing a time offset for resolving the above deficiencies when the system is in an operating mode.

In an implementation, the present disclosure is to a system including a signal generator, parallel analog-to-digital converters (ADCs), first, second, and third parallel filters, an adaptive gain circuit, an accumulator circuit, a first multiplier circuit, and a memory circuit. The signal generator is configured for providing a first signal during a calibration mode for the system. The parallel ADCs provide ADC outputs associated with the first signal. The first parallel filters provide derivative signals associated with the ADC outputs. The second parallel filters provide first band-stop filtered signals associated with the ADC outputs. The third parallel filters provide second band-stop filtered signals associated with the derivative signals. The multiplier circuit features multiplying the first and the second band-stop filtered signals to provide multiplied signals that include correlation information from the first and the second band-stop filtered signals. The adaptive gain circuit selects a portion of the multiplied signals. The accumulator circuit provides accumulator output for the selection of the portion of the multiplied signals, which can be stored in the memory circuit. The system incorporating these components and performing these features is, accordingly, calibrated.

In another implementation, the present disclosure is to a method that includes the following features. A providing feature of the method provides, from a signal generator, a first signal during a calibration mode. A further providing feature uses parallel analog-to-digital converters (ADCs) to provide ADC outputs associated with the first signal. Yet another providing feature that follows uses first parallel filters to provide derivative signals associated with the ADC outputs. A subsequent providing feature incorporates second parallel filters to provide first band-stop filtered signals associated with the ADC outputs. Another providing feature incorporates third parallel filters to provide second band-stop filtered signals associated with the derivative signals. A multiplication feature, using a multiplier circuit, multiplies the first and the second filtered signals to provide multiplied signals including correlation information from the first and the second band-stop filtered signals. A selecting feature, using an adaptive gain circuit, selects a portion of the multiplied signals. A final providing feature provides, from an accumulator circuit, accumulator output for the selection of the portion of the multiplied signals, wherein the accumulator output is stored into a memory circuit. The method, accordingly incorporated using these features, calibrates a system that includes the ADCs.

BRIEF DESCRIPTION OF THE DRAWINGS

The accompanying drawings constitute a part of this specification and, together with the specification, illustrate certain exemplary implementations of this disclosure.

DETAILED DESCRIPTION

Systems and methods in accordance with various embodiments of the present disclosure may overcome one or more of the aforementioned and other deficiencies experienced in conventional approaches to calibrate high speed ADCs. The ADCs are for converting a mixed analog signal to a mixed digital signal. Embodiments herein provide a method for integrated circuit implementation, which includes a system with a signal generator, parallel analog-to-digital converters (ADCs), first and second parallel filers, a multiplier circuit, and a subtraction circuit. The signal generator is configured for providing a first signal during a calibration mode for the system. The parallel ADCs provide ADC outputs associated with the first signal. The first parallel filters provide derivative signals associated with the ADC outputs. The second parallel filters then provide filtered derivative signals associated with the derivative signals. The multiplier circuit features multiplying for the filtered derivative signals with an offset factor that is determined based at least in part on the derivative signals and a system output to provide offset derivative signals. Further, the subtraction circuit provides subtraction of the offset derivative signals from the ADC outputs. The system incorporating these components to perform these features is, accordingly, calibrated Various other functions and advantages are described and suggested below as may be provided in accordance with the various embodiments.

Figure 1:
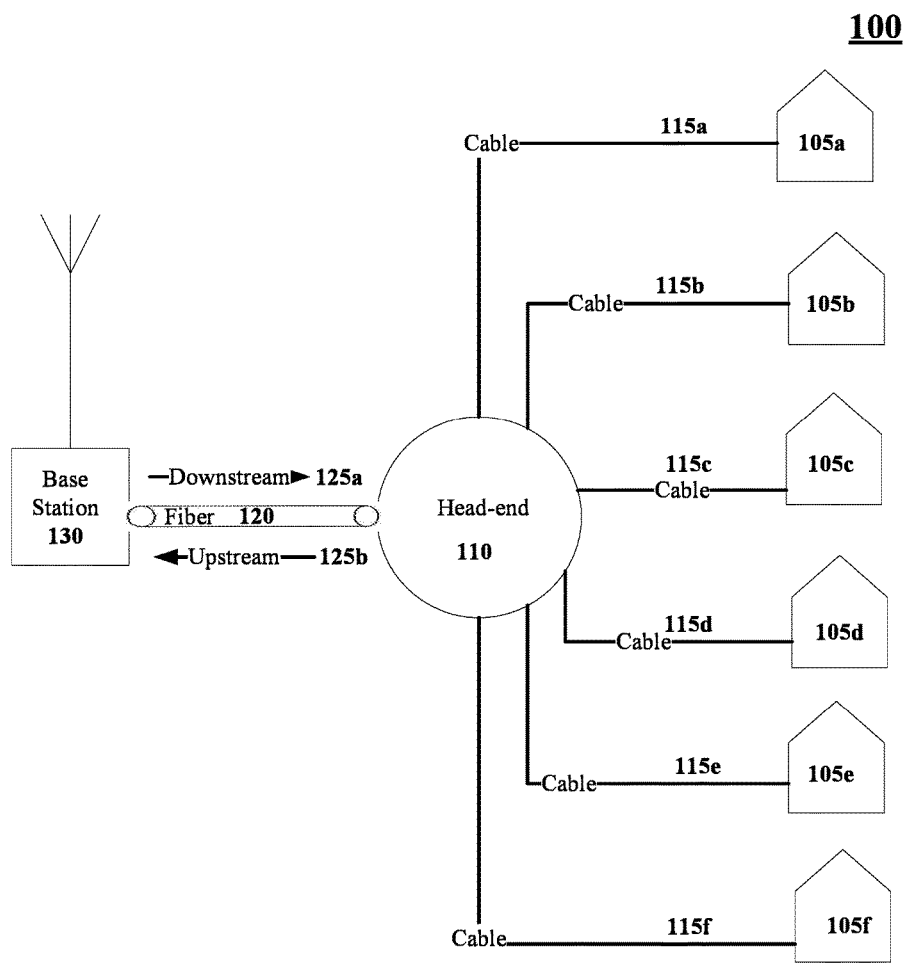
FIG. 1 illustrates an exemplary communications network in accordance with various embodiments.

FIG. 1 illustrates a communications network 100, where the present disclosure is applicable, in one aspect. The communications network 100 includes at least a base station 130, a head-end 110, and subscriber facilities 105a-f. The base station 130 is typically in communication with the head-end via fiber 120, although other communication systems, including physical and virtual (e.g., wired and wireless) systems may connect the base station 130 to the head-end 110. The head-end is in communication with the subscriber facilities 105 via cable 115a-f, although other communication systems, including fiber (similar to the base station's connection with the head-end), or other physical and virtual (e.g., wired and wireless) systems may connect the head-end 110 to the subscriber facilities 105. The communications network 100 supports upstream and downstream traffic via both the fiber 125—where the traffic is illustrated as element numeric 125a-b, and the cable 115.

The subscriber facilities 105 include modems and, optionally, routers, both of which may be wired or wireless type devices. The upstream and downstream signals from cable 115 transmit digital signals carrying data for voice, telephony, television, and other services, over radio frequency (RF) carrier signals to the modem. In a two-way communication network, one or more carrier signals are designated to transmit data in the downstream direction, from the head-end to the modem at a subscriber facility 105, while other carrier signals are designated to transmit data in the upstream direction, from the subscriber facility 105 to upstream components in the communications network 100, e.g., the head-end 110, and subsequently, the base station 130. The modems at each subscriber facility 105 convert the data as required for the upstream or downstream transmission—for e.g., from a digital format to a RF modulated signals in the upstream direction into the communications network 100, and from RF signals to digital format for the downstream direction consuming devices. A cable modem termination system (CMTS) performs the opposite operation for multiple subscribers at the cable operator's head-end.

The downstream and upstream transmissions can occur in, for example, a 6 MHz bandwidth channel. As described above, the downstream portion is designated to a predetermined portion of the available bandwidth, with the upstream portion designated to the remainder. Moreover, subscriber facilities that are condominium-styled facilities are designated to share bandwidth from singular cables, in some instances. As more components populate modems and related devices to process the bandwidth signals, time offsets from clock sources accumulate. The use of the calibration system or method, as presently disclosed for these networks, at least correcting these time offsets.

Figure 2:
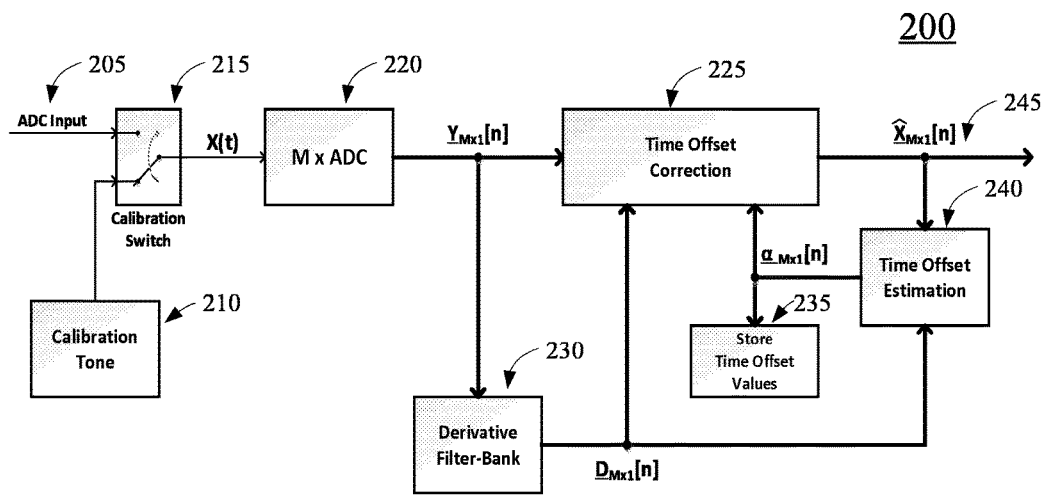
FIG. 2 is a block diagram of a system for calibration of high speed ADCs, in accordance with various embodiments of the present disclosure.

FIG. 2 is a block diagram of a system 200 for calibration, in accordance with various embodiments of the present disclosure. A regular ADC input signal is provided via source 205 to the system 200, in an implementation. During a calibration mode, however, a calibration switch 215 is available to isolate the regular ADC input 205 and to use a calibration tone from a tone source 210 to calibrate the system 200. The switch 215 is illustrated for exemplary purposes as single pole double throw switch, but it is understood to a person of ordinary skill that other configurations of physical switches or semiconductor switches (e.g., transistors) are also applicable herein. Calibration tone from calibration tone source 210 represents known frequency and phase signals, in one example. The calibration tone, in one example, is a signal of a known frequency but with an unknown amplitude or phase.

The system 200 includes parallel ADCs 220 (illustrated as M×ADC, where M is a number of parallel ADCs) provided to convert the received analog calibration tone or ADC input, X(t), from respective sources 205/210 to a digital signal, $\underline{Y}_{M\times 1}[n]$ that is representative of the ADCs' output. In an implementation, ADCs 220 are time-interleaved high-speed ADCs. ADCs 220 may consist of M parallel ADCs with the same input signal but different sampling clock sources. These different clock sources have the same sampling clock frequency but different sampling clocks phases, for example. In a further example, when M is the number of parallel ADCs and assuming $T_S$ as sampling clock of each ADC, then sampling times are:

$$\text{ADC \#1: CLK1} = (nM+1)T_S \qquad \text{Eq (1)}$$

$$\text{ADC \#2: CLK2} = (nM+2)T_S \qquad \text{Eq (2)}$$

. . .

$$\text{ADC \#}M\text{: CLKM} = (nM+M)T_S \qquad \text{Eq (3)}$$

Figure 5:
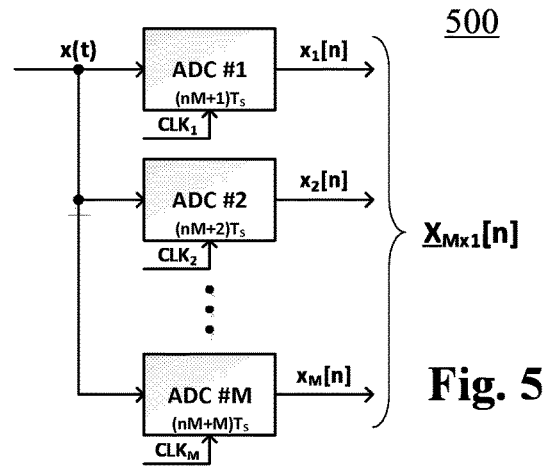
FIG. 5 illustrates clock source inputs for parallel ADCs for the present system, in accordance with various embodiments of the present disclosure.

Based, at least in part, on these sampling times, the overall sampling period is taken as $MT_s$ and is, therefore, the overall sampling clock is $1/MT_s$. FIG. 5 illustrates clock source inputs 500 for parallel ADCs for the present system, in accordance with various embodiments of the present disclosure. Each of ADCs, marked in FIG. 5 as ADC #1, ADC #2, . . . ADC #M, receive the X(t) ADC input as well as clocks $CLK_1$, $CLK_2$, . . . $CLK_M$. FIG. 5 also illustrates that the function in the ADCs are (nM+1)Ts, (nM+2)Ts . . . (nM+M)Ts. The sampled signal provided at output $X_{M\times 1}[n]$ is determined as in equation (4).

$$\underline{X}_{M\times 1}[n] \triangleq \begin{pmatrix} x_1[n] \\ x_2[n] \\ x_3[n] \\ \vdots \\ x_M[n] \end{pmatrix} \triangleq \begin{pmatrix} x((nM+1)\cdot T_S) \\ x((nM+2)\cdot T_S) \\ x((nM+3)\cdot T_S) \\ \vdots \\ x((nM+M)\cdot T_S) \end{pmatrix} \qquad \text{Eq (4)}$$

The system 200 is, however, calibrated to address time offset errors from the different source clocks $CLK_1$, $CLK_2$, . . . $CLK_M$. The time offsets may be unknown quantities from each time source. Taking time offsets into consideration in the above example, when M is the number of parallel ADCs and $T_S$ is a respective sampling clock of each ADC, then the sampling times are, instead:

ADC #1: $CLK_1(nM+1)T_S+\alpha_1 T_S$  Eq (5)

ADC #2: $CLK_2(nM+2)T_S+\alpha_2 T_S$  Eq (6)

...

ADC #M: $CLK_M=(nM+M)T_S+\alpha_M T_S$  Eq (7)

Figure 6:
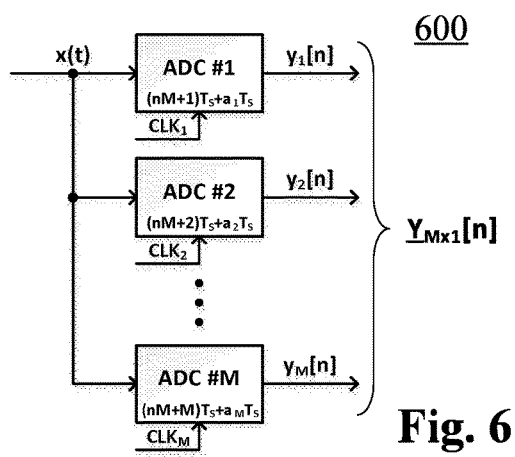
FIG. 6 illustrates clock source inputs and calibrated correction in parallel ADCs for the present system, in accordance with various embodiments of the present disclosure.

FIG. 6 illustrates clock source inputs and calibrated correction 600 in parallel ADCs for the present system, in accordance with various embodiments of the present disclosure. Each of ADCs, marked in FIG. 6 as ADC #1, ADC #2, etc. to ADC #M, receive the X(t) ADC input as well as clocks $CLK_1$, $CLK_2$, etc. to $CLK_M$. FIG. 6 contrasts FIG. 5 because the function in the ADCs are $(nM+1)Ts+\alpha_1 T_s$, $(nM+2)Ts+\alpha_M T_s$ ... $(nM+M)+\alpha_M T_s$. The sampled signal provided at the system output $X_{M\times 1}[n]$ 245 is, therefore, inclusive of a time offset correction as in equation (8):

$$\underline{Y}_{M\times 1}[n] \triangleq \begin{pmatrix} y_1[n] \\ y_2[n] \\ y_3[n] \\ \vdots \\ y_M[n] \end{pmatrix} \triangleq \begin{pmatrix} x((nM+1+\alpha_1)\cdot T_S) \\ x((nM+2+\alpha_2)\cdot T_S) \\ x((nM+3+\alpha_3)\cdot T_S) \\ \vdots \\ x((nM+M+\alpha_M)\cdot T_S) \end{pmatrix} \quad \text{Eq (8)}$$

The system 200 is configured to use a first order approximation in its calibration, such that the signal of equation (8) may be written as:

$$\underline{Y}[n] \cong \underline{X}[n]+\underline{\alpha}^T \cdot \underline{D}[n] \quad \text{Eq (9)}$$

Figure 7:
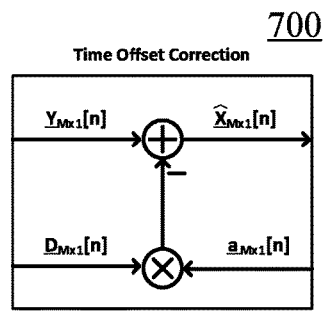
FIG. 7 illustrates flow of signals for time offset correction, in accordance with various embodiments of the present disclosure.

FIG. 7 also illustrates flow of signals for time offset correction in support of equation 9, in accordance with various embodiments of the present disclosure. In the equations herein, including equations 4 and 8, the symbol Δ is a vector of the sampling time offset errors given by:

$$\underline{\alpha}_{M\times 1} \triangleq \begin{pmatrix} \Delta_1 \\ \Delta_2 \\ \Delta_3 \\ \vdots \\ \Delta_M \end{pmatrix}_{M\times 1} \quad \text{Eq (10)}$$

In equation 9, $\underline{D}[n]$ is a derivative of the input signal and determined as in Equation (11):

$$\underline{D}[n] \triangleq \begin{pmatrix} d_1[n] \\ d_2[n] \\ d_3[n] \\ \vdots \\ d_M[n] \end{pmatrix} \triangleq \begin{pmatrix} d((nM+1)\cdot T_S) \\ d((nM+2)\cdot T_S) \\ d((nM+3)\cdot T_S) \\ \vdots \\ d((nM+M)\cdot T_S) \end{pmatrix} \cong \begin{pmatrix} d((nM+1+\alpha_1)\cdot T_S) \\ d((nM+2+\alpha_1)\cdot T_S) \\ d((nM+3+\alpha_1)\cdot T_S) \\ \vdots \\ d((nM+M+\alpha_1)\cdot T_S) \end{pmatrix} \quad \text{Eq (11)}$$

Accordingly, the sampling time offset error in signal $\underline{Y}[n]$, may be compensated using equation (12):

$$\hat{\underline{X}}[n] \cong \underline{Y}[n]+\underline{\alpha}^T \cdot \underline{D}[n] \quad \text{Eq (12)}$$

In equation (12), $\underline{\alpha}$ is the unknown sampling time offset error vector for estimation via the present calibration method and system. The derivative signal $\underline{D}[n]$ should be extracted using a digital filter from the ADC input signal $\underline{Y}[n]$.

The switch 215 in system 200 is configured to switch the system input from the ADC input 205 to the calibration tone 210 during a calibration mode, also referred to herein as the estimation phase. Calibration tones from calibration source 210 are available in known frequency and phase signals; or in known frequency but with an unknown amplitude or phase, in some examples, as noted above. In a further example, a function of an applicable calibration tone is as in equation (13).

$$\frac{F_S}{2}\left(1-\frac{2k+1}{2M}\right) \quad \text{Eq (13)}$$

In equation (13), k is an integer number from the set of {0, 1, 2, ..., M–1}. {0, 1, 2, ..., M–1}

The derivative filter bank 230 of system 200 is configured, in an example, as a set of M parallel filters for measuring the derivative of the outputs of the M parallel ADCs 220, before the time-offset correction is applied. In an application, the derivative filter bank 230 applies a Hilbert transform to determine the derivatives of the outputs represented as $\underline{Y}_{M\times 1}[n]$. In system 200, time offset correction is, functionally, a circuit implementation to compensate the effect of time offset error using the following inputs, functions, and multipliers as in equation (14).

$$\hat{\underline{X}}[n] \cong \underline{Y}[n]+\underline{\alpha}^T \cdot \underline{D}[n] \quad \text{Eq (14)}$$

The derivative of the ADCs output, via the derivative filter bank 230, $D_{M\times 1}[n]$, is input to the time offset estimation component 240. FIG. 7 also illustrates the flow 700 of time offset signals and the time offset in the correction mode. For example, ADC input signals with error $\underline{Y}_{M\times 1}[n]$ are subjected to removal of the estimated time offset provided in the form of the multiplier of signals represented by $\underline{\alpha}_{M\times 1}$ and $\underline{D}[n]$, resulting in the corrected output signal $\hat{\underline{X}}_{M\times 1}[n]$.

Figure 3:
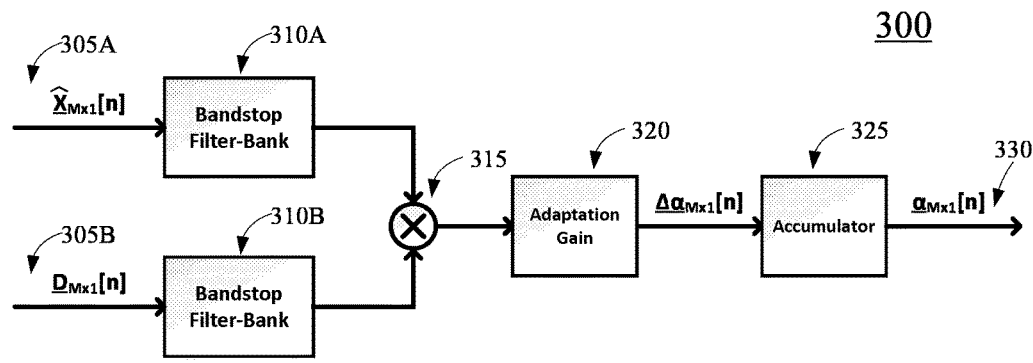
FIG. 3 is another block diagram of a system for offset estimation, in accordance with various embodiments of the present disclosure.

The time offset estimation block 240 is based at least in part on an least mean square algorithm for estimation of $\alpha_{M\times 1}$, using the known value of $\underline{D}[n]$ and the feedback from $\hat{\underline{X}}[n]$. FIG. 3 illustrates, via a block diagram 300, a system 200 for offset estimation, in accordance with various embodiments of the present disclosure. FIG. 3 details the features of the time offset estimation block 240. For example, in FIG. 3, two band-stop filter banks 310A-B are provided, one to filter the derivative signals $D_{M\times 1}[n]$ on line 305A, and the other to filter the system or ADC outputs $\hat{\underline{X}}_{M\times 1}[n]$ on line 305B. In an implementation, the system or ADC outputs may or may not include time offset corrections. The time offset estimation block 240 may be seen as a sub-system for an adaptive filter bank, e.g., block 310A, that can be configured to follow a desired filter bank, e.g., 310B. The configuration attempts to determine coefficients associated with producing the least mean square (LMS) of any error between the desired and the actual signal, which are represented as inputs to the desired filter bank and the adaptive filter bank, respectively. In the present implementation, the band-stop filter bank 310 is a set of parallel filters for filtering the applied signal at its respective inputs. In the calibration process, using a calibration tone, the filter bank 310B filters the calibration tone as an improvement of the time offset error estimation.

Figure 4:
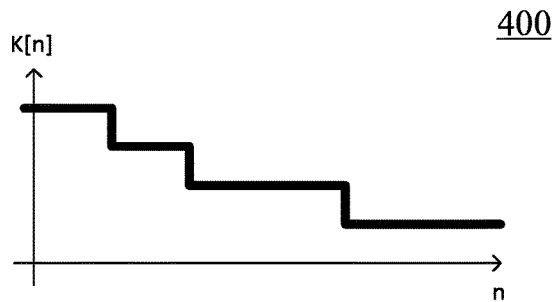
FIG. 4 is a graph illustrating the relationship between convergence speed and tone for the present system, in accordance with various embodiments of the present disclosure.

A combination circuit 315, e.g., a multiplier, provides multiplication of first band-stop filtered signals associated with the ADC outputs and second band-stop filtered signals associated with the derivative signals. The combination circuit 315 provides first multiplied signals from the multiplication, which represents correlation information between the first and the second band-stop filtered signals. The adaptive signal component, represented by the band-stop filter banks 310A-310B, forms a known or unknown signal provisioning component. For example, in the present implementation, an unknown derivative of the calibration tone is used for the known or unknown signal component via circuit features 210-220. The adaptation or adaptive gain circuit 320 amplifies or selects a portion of the multiplied signals for further processing. Such amplification or selection may be in accordance with a predetermined convergence speed and a predetermined system error for the signals of the system. In an example, the adaptation or adaptive gain circuit amplifies and/or selects the error component of the combination circuit 315 and provides it to accumulator circuit 325 for accumulation. In an example, the adaptation gain is a gain smaller than 1, and could be a fixed or a variable value, with respect to time. A variable gain can improve the speed of convergence of the respective adaptive and calibration tone signals. In an aspect of the present disclosure, the variable gain in adaptation gain block 320 defines a loop gain that is variable for controlling the speed of convergence of the circuit signals. The gain is represented as K[n]. Higher values for K provide faster convergence speed, while lower values for K provide slower convergence. This is illustrated in the graph 400 of FIG. 4. The accumulator circuit 325 integrates $\underline{\Delta\alpha}_{M\times1}$ to generate accumulated output or signal, $\alpha_{M\times1}$, at the time offset estimation block output 330 using the following formula:

$$\underline{\alpha}_{M\times1}[n+1]=\underline{\alpha}_{M\times1}[n]+\underline{\Delta\alpha}_{M\times1}[n] \qquad \text{Eq (15)}.$$

In an implementation, the time offset estimation block 240 provides accumulator output 330 that is also referred to herein as an estimated time offset. The estimated time offset is available for multiplying with filtered derivative signals from block 230 to provide offset derivative signals. The system 200 incorporating these components and performing these features is, accordingly, calibrated in the calibration mode. Separable components are included or combined in the system 200 to enable a correction mode. For example, a second multiplier circuit features a second multiplying operation for the estimated time offset and the first band-stop filtered signals to provide a second multiplied signal. Accordingly, the estimated time offset correction is applied based at least in part on the derivative signals $\underline{D}_{M\times1}[n]$ and the system or the ADC output $\underline{\hat{X}}_{M\times1}[n]$ to provide the offset derivative signals. For example, using the second multiplier circuit, multiplication of the estimated time offset and the first band-stop filtered signals provide the second multiplied signal. A subtraction circuit included or different from the time offset correction block 225 then performs subtraction of the second multiplied signal and the ADC outputs. The system 200 incorporating these components and performing these features is, accordingly, in the correction mode.

In another implementation, the estimated time offset or the value(s) of the accumulated output or signal is stored in a storage or memory circuit 235 for use with the system 200 in the operational or correction mode and with the ADC input 205. Accordingly, in the operational or correction mode, the switch 215 is connected so as to allow the ADC input 205 into the system 200. Furthermore, the stored offset factor of the accumulated signal in storage circuit 235 is applied to the filtered ADC input, following the output of the block 220. In this configuration, the time offset estimation block 240 is ignored or isolated from the system 200 by any process, such as using electromechanical or semiconductor switches, or via high impedance modes applied at the input to block 240. The derivative filter bank 230 includes first parallel filters for providing derivative signals associated with the ADC outputs from ADCs 220.

The time offset estimation circuitry 240 provides second parallel filters for providing first band-stop filtered signals associated with the ADC outputs. This is also illustrated via filter bank 310B of FIG. 3. The time offset estimation circuitry 240 also includes third parallel filters for providing second band-stop filtered signals associated with the derivative signals. This is illustrated via filter bank 310A of FIG. 3. A first multiplier circuit, illustrated as combination circuit 315, multiplies the first and the second band-stop filtered signals to provide multiplied signals that include correlation information from the first and the second band-stop filtered signals. In the correction mode, which may use separable components than the circuit of the calibration mode within system 200/300, a second multiplier circuit multiplies the estimated time offset and the first band-stop filtered signals to provide a second multiplied signal. A subtraction circuit provides subtracted signals from subtracting the second multiplied signal and the ADC outputs. The second multiplier circuit and the subtraction circuits may be part of the time offset correction circuitry 225.

Figure 8:
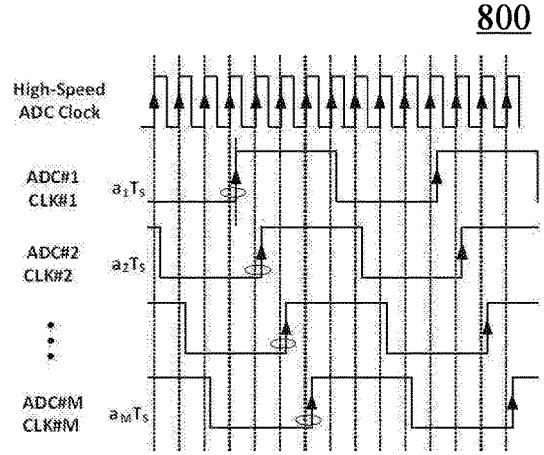
FIG. 8 is an example of a timing diagram showing a time offset error, in accordance with various embodiments of the present disclosure.
Figure 9:
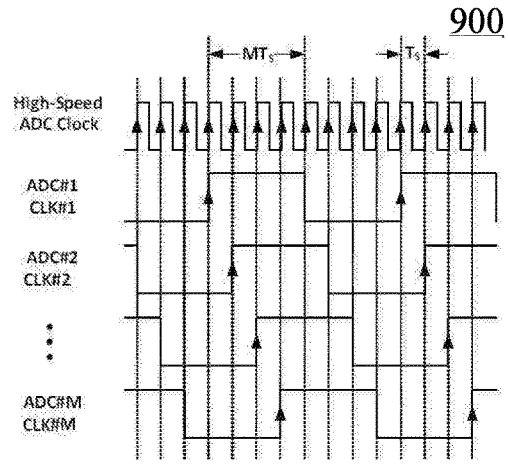
FIG. 9 is an example of a timing diagram showing correction to a time offset error, in accordance with various embodiments of the present disclosure.

FIGS. 8 and 9 provide examples of timing diagrams 800-900 showing a time offset error and the correction provided to remove the error, in accordance with various embodiments of the present disclosure. The high speed ADC clock is provided in both time flow diagrams 800-900, with a time offset error in FIG. 8. The error for each ADC signal (ADC#1, ADC#2 . . . ADC#M) and the respective reference clock (CLK#1, CLK#2 . . . CLK#M) are illustrated in the timing of multipliers $a_1Ts, a_2Ts \ldots a_MTs$. The corrections to the time offset error are illustrated in FIG. 9 with no time offset errors in the signals of flow diagram 900. FIG. 8 also demonstrates the use of low frequency clock signals working in parallel to generate a higher frequency clock signal, which is subject to offset errors that are correctable as in figured 9.

Figure 10:
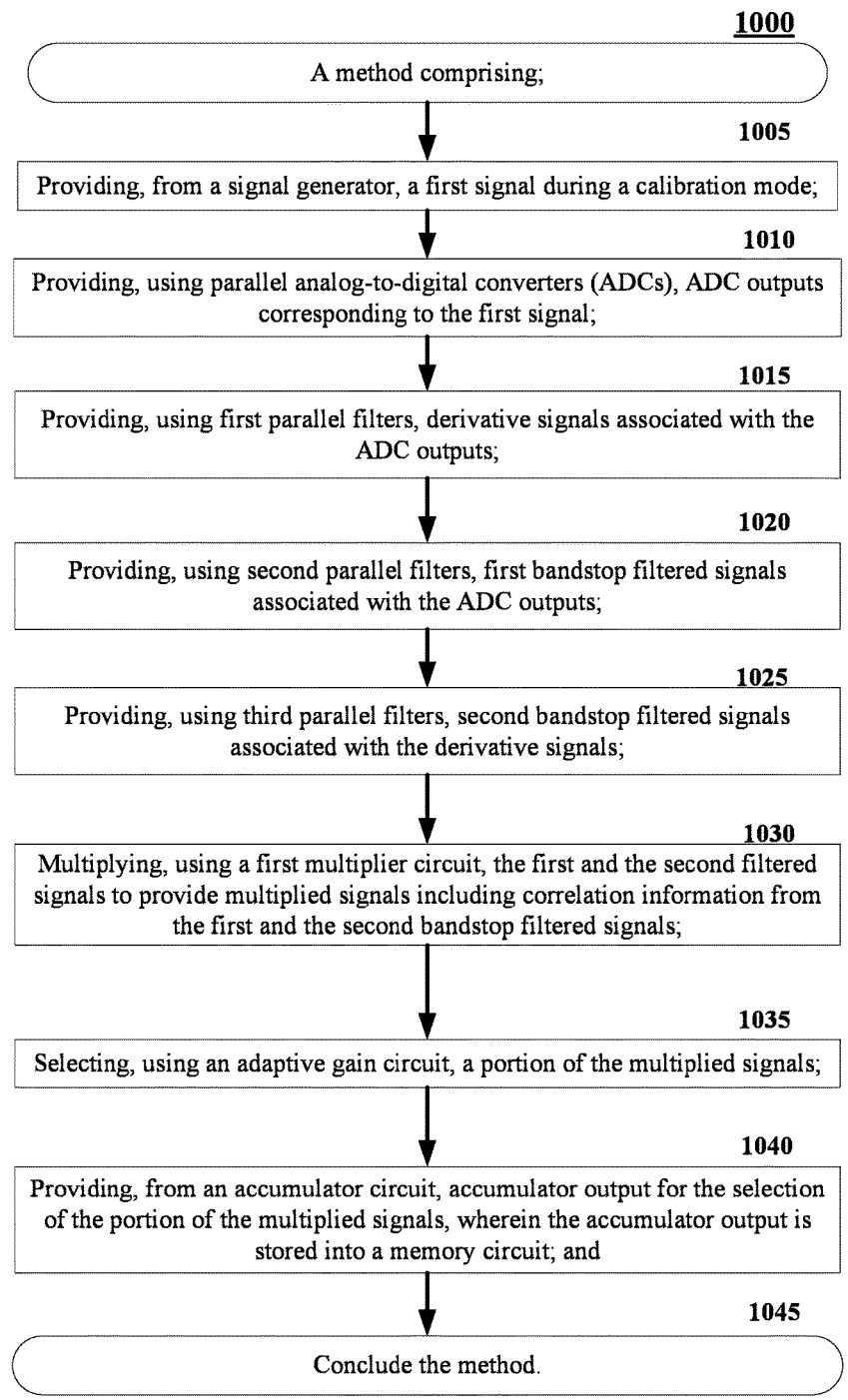
FIG. 10 is a flowchart a method for calibration of high speed ADCs, in accordance with various embodiments of the present disclosure.

FIG. 10 is a flowchart for a calibration method 1000, in accordance with various embodiments of the present disclosure. A first providing feature of block 1005, from a signal generator, provides a first signal during a calibration mode. A second providing feature of block 1010 provides uses parallel analog-to-digital converters (ADCs) to provide ADC outputs associated with the first signal. A third providing feature of block 1015 uses first parallel filters to provide derivative signals associated with the ADC outputs. Block 1020 is a fourth providing feature that uses second parallel filters for providing first band-stop filtered signals associated with the ADC output. A fifth providing feature, via block 1025, incorporates third parallel filters to provide second band-stop filtered signals associated with the derivative signals. A multiplication feature of block 1030, using a multiplier circuit, multiplies the first and the second filtered signals to provide multiplied signals including correlation information from the first and the second band-stop filtered signals. A selecting feature of block 1035, using an adaptive gain circuit, selects a portion of the multiplied signals. A final providing feature provides, via block 1040, using an accumulator circuit, accumulator output for the selection of the portion of the multiplied signals. The accumulator output is stored into a memory circuit. Block 1045 concludes this method, which when incorporating these features, results in a calibrated system that includes the ADCs.

The various embodiments can be implemented in a wide variety of operating environments, which in some cases can include one or more user electronic devices, integrated circuits, chips, and computing devices—each with the proper configuration of hardware, software, and/or firmware as presently disclosed. Such a system can also include a number of the above exemplary systems working together to perform the same function disclosed herein—to filter tones from a mixed signal using novel integrated circuits in a communications network.

Most embodiments utilize at least one communications network that would be familiar to those skilled in the art for supporting communications using any of a variety of commercially-available protocols, such as TCP/IP, FTP, UPnP, NFS, and CIFS. The communications network can be, for example, a cable network, a local area network, a wide-area network, a virtual private network, the Internet, an intranet, an extranet, a public switched telephone network, an infra-red network, a wireless network and any combination thereof.

The environment can include a variety of data stores and other memory and storage media as discussed above—including at least a buffer. These storage components can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system may also include one or more storage devices, such as disk drives, optical storage devices and solid-state storage devices such as random access memory (RAM) or read-only memory (ROM), as well as removable media devices, memory cards, flash cards, etc.

Such devices can also include a computer-readable storage media reader, a communications device (e.g., a modem, a network card (wireless or wired), an infrared communication device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and other non-transitory computer readable media for containing code, or portions of code, can include any appropriate media known or used in the art, such as but not limited to volatile and non-volatile, removable and non-removable media implemented in any method or technology for storage of information such as computer readable instructions, data structures, program modules or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A system comprising:
   a signal generator for providing a first signal during a calibration mode for the system;
   parallel analog-to-digital converters (ADCs) for providing ADC outputs associated with the first signal;
   first parallel filters for providing derivative signals associated with the ADC outputs;
   second parallel filters for providing first band-stop filtered signals associated with the ADC outputs;
   third parallel filters for providing second band-stop filtered signals associated with the derivative signals;
   a first multiplier circuit for multiplying the first and the second band-stop filtered signals to provide first multiplied signals including correlation information from the first and the second band-stop filtered signals;
   an adaptive gain circuit for selecting a portion of the first multiplied signals; and
   an accumulator circuit for (a) providing accumulator output for the selection of the portion of the first multiplied signals and (b) storing the accumulator output into a memory circuit.

2. The system of claim 1, wherein the system further comprises:
   the adaptive gain circuit for the selecting selects the portion in accordance with a predetermined convergence speed and a predetermined system error.

3. The system of claim 2, wherein the accumulator output is an estimated time offset for calibrating the system.

4. The system of claim 3, further comprising, as part of a correction mode:
   a second multiplier circuit for multiplying the estimated time offset and the first band-stop filtered signals to provide a second multiplied signal; and
   a subtraction circuit for providing subtracted signals from subtracting the second multiplied signal and the ADC outputs.

5. The system of claim 1, wherein the adaptive gain circuit is configured for applying a gain as a fixed or a variable gain during the selecting.

6. The system of claim 4, wherein the system further comprising the correction mode is separable from the system and in communication with the system.

7. The system of claim 1, wherein the system further comprising the memory circuit for the storing of the accumulator output is a calibrated system.

8. The system of claim 1, wherein the accumulator circuit is configured for signal integration, over time, for the selection of the portion of the first multiplied signals to provide estimated time offset, wherein the estimated time offsets applied to the ADC outputs reflect a calibration of the system.

9. The system of claim 8, wherein the accumulator circuit provides the estimated time offset using a least mean square (LMS) calculation applied to the selection of the portion of the first multiplied signals.

10. The system of claim 1, wherein the first parallel filters provide the derivative signals using a Hilbert transform.

11. A method comprising:
provided, from a signal generator, a first signal during a calibration mode;
providing, using parallel analog-to-digital converters (ADCs), ADC outputs associated with the first signal;
providing, using first parallel filters, derivative signals associated with the ADC outputs;
providing, using second parallel filters, first band-stop filtered signals associated with the ADC outputs;
providing, using third parallel filters, second band-stop filtered signals associated with the derivative signals;
multiplying, using a first multiplier circuit, the first and the second band-stop filtered signals to provide first multiplied signals including correlation information from the first and the second band-stop filtered signals;
selecting, using an adaptive gain circuit, a portion of the first multiplied signals; and
providing, from an accumulator circuit, accumulator output for the selection of the portion of the first multiplied signals, wherein the accumulator output is stored into a memory circuit.

12. The method of claim 11, wherein the selecting is in accordance with a predetermined convergence speed and a predetermined system error.

13. The method of claim 12, wherein the accumulator output is an estimated time offset for calibrating the system.

14. The method of claim 13, wherein the method further comprises a correction mode for:
multiplying, using a second multiplier circuit, the estimated time offset and the first band-stop filtered signals to provide a second multiplied signal; and
providing, using a subtraction circuit, subtracted signals from subtracting the second multiplied signal and the ADC outputs.

15. The method of claim 11, wherein the selecting for the portion of the first multiplied signals further comprises applying a gain as a fixed or a variable gain to the portion of the first multiplied signals.

16. The method of claim 14, wherein further comprising: providing separable components for performing the correction mode and the calibration mode.

17. The method of claim 11, wherein the method further comprises:
storing, using the memory circuit, the accumulator output, thereby representing available calibration for a system implementing the method.

18. The method of claim 11, wherein the method further comprises:
signal integration, over time, for the selection of the portion of the first multiplied signals to provide estimated time offset, wherein the estimated time offsets applied to the ADC outputs reflect a calibration of the system.

19. The method of claim 18, wherein the providing of the estimated time offset uses a least mean square (LMS) calculation applied to the selection of the portion of the first multiplied signals.

20. The method of claim 1, wherein the method further comprises:
providing, using the first parallel filters, the derivative signals by applying a Hilbert transform.

* * * * *